(12) United States Patent
Beauvy et al.

(10) Patent No.: US 7,799,385 B2
(45) Date of Patent: Sep. 21, 2010

(54) METHOD OF PREPARATION OF MONOLITHIC HYDRATED ALUMINAS, AMORPHOUS OR CRYSTALLINE ALUMINAS, ALUMINATES AND COMPOSITE MATERIALS BY OXIDATION OF ALUMINIUM OR OF AN ALUMINIUM ALLOY

(75) Inventors: Michel Beauvy, Jouques (FR); Jean-Louis Vignes, L'Haÿ les Roses (FR); Daniel Michel, Paris (FR); Léo Mazerolles, Savigny Rue Orge (FR); Claude Frappart, Paris (FR); Thomas Di Costanzo, Rennes (FR)

(73) Assignees: Commissariat a l'Energie Atomique, Paris (FR); Centre National de la Recherche, Paris (FR)

( * ) Notice: Subject to any disclaimer, the term of this patent is extended or adjusted under 35 U.S.C. 154(b) by 1039 days.

(21) Appl. No.: 10/534,611

(22) PCT Filed: Nov. 20, 2003

(86) PCT No.: PCT/FR03/50126

§ 371 (c)(1),
(2), (4) Date: Nov. 2, 2005

(87) PCT Pub. No.: WO2004/048270

PCT Pub. Date: Jun. 10, 2004

(65) Prior Publication Data

US 2006/0115597 A1    Jun. 1, 2006

(30) Foreign Application Priority Data

Nov. 21, 2002   (FR) .................................. 02 14579

(51) Int. Cl.
*B24B 1/00* (2006.01)
*B05D 3/12* (2006.01)
*C01F 7/02* (2006.01)

(52) U.S. Cl. .................... 427/376.7; 427/289; 427/226; 427/290; 423/628; 451/28; 420/526; 420/527

(58) Field of Classification Search ................. 427/290, 427/407, 376.4, 376.7; 423/628; 451/28
See application file for complete search history.

(56) References Cited

U.S. PATENT DOCUMENTS

| | | | | |
|---|---|---|---|---|
| 2,982,614 A | * | 5/1961 | Lanyi et al. | 423/625 |
| 3,003,952 A | * | 10/1961 | Cramer et al. | 208/138 |
| 3,390,988 A | * | 7/1968 | Helfferich et al. | 430/153 |
| 4,151,267 A | * | 4/1979 | Puskas | 423/626 |
| 4,778,779 A | * | 10/1988 | Murrell et al. | 502/263 |
| 5,187,138 A | * | 2/1993 | Davis | 502/255 |

OTHER PUBLICATIONS

Markel, E.J. et al., "Aerogel monoliths produced by direct oxidation of aluminum", Journal of Non-Crystalline Solids, Dec. 1, 1994, pp. 32-39, vol. 180, No. 1, North Holland Physics Publishing, Amsterdam, NL.
Nakagawa, Z. et al., "Crystallization of amorphous alumina prepared by hydration of Al-amalgam", Chemical Abstracts + Indexes, Apr. 4, 1994, p. 235, vol. 120, No. 14, American Chemical Society, Columbus, US.
Ram, S et al., "Synthesis of mesoporous clusters of AlO(OH) αH$_2$O by a surface hydrolysis reaction of pure Al-metal with nascent-surface in water", Materials Letters, Jan. 2000, pp. 52-60, vol. 42, No. 1-2, North Holland Publishing Company, Amsterdam, NL.
Ram, S. et al., "Thermal Desorption Process of Water in Amorphous AlO(OH) αH$_2$O fibres prepared by an electrochemical method", Material Transactions JIM, 1998, pp. 485-491, vol. 39, No. 4.
Wislicenus, Von H., "Ueber die faserahnliche gewachsene tonerde (fesertonerde) und ihre oberflachenwirkungen(adsorption)", Kolloid Z., 2, 1908, 11, p. 1, lines 25-31.

* cited by examiner

*Primary Examiner*—Michael Barr
*Assistant Examiner*—Ryan Schiro
(74) *Attorney, Agent, or Firm*—Brinks Hofer Gilson & Lione

(57) ABSTRACT

The subject of the present invention is a method of preparation of a monolithic hydrated alumina by the oxidation of aluminium or an aluminium alloy in the presence of a mercury amalgam that contains at least one noble metal, such as silver. This hydrated alumina serves inter alia as base product in methods of preparation of amorphous or crystalline aluminas, or of aluminates, which themselves serve as base products for methods of preparation of composite materials based on oxides, on metals, on carbon products and/or on polymers. Application of the said products obtained by the said methods in many fields, such as catalysis, thermal and acoustic insulation, magnetism, waste storage, and preparation of radioelement transmutation targets.

48 Claims, No Drawings

METHOD OF PREPARATION OF MONOLITHIC HYDRATED ALUMINAS, AMORPHOUS OR CRYSTALLINE ALUMINAS, ALUMINATES AND COMPOSITE MATERIALS BY OXIDATION OF ALUMINIUM OR OF AN ALUMINIUM ALLOY

TECHNICAL FIELD

The present invention relates to a method of preparation of an ultra porous hydrated alumina in the form of monoliths, the said alumina serving inter alia as a base product for the preparation of monolithic, amorphous or crystalline, anhydrous aluminas, monolithic aluminates and monolithic composites.

PRIOR ART

The general field of the invention is therefore that of the preparation of aluminas.

In the prior art there are many methods of preparing aluminas by oxidation of aluminium in air.

Thus, in 1908, H. Wislicenus, in reference [1]: Kolloid Z., 2, 1908, 11, described the use of pure mercury deposited on a part made of aluminium or aluminium alloy, so as to obtain alumina in the form of filaments or powders. However, this method does not allow alumina to be obtained in monolithic form, that is to say in the form of porous blocks.

More recently, J. Markel et al., in reference [2]: Journal of Non-Crystalline Solids, 180 (1994), 32 described a process for manufacturing hydrated alumina monoliths, comprising a step of depositing mercury on an aluminium surface, the said mercury being obtained by the reduction of mercuric ions in a nitric acid solution. This solution firstly allows the passivation layer present on the aluminium surface to be dissolved and then allows an amalgam to be formed with the mercury. This amalgam protects the aluminium part from the phenomenon of aluminium passivation by oxygen and catalyses the alumina formation reaction, by the reaction of the aluminium ions in the open air.

However, the method explained above allows aluminium monoliths to be grown at the very most to a few millimeters in size, provided, in addition, that the heat released by the reaction is vigorously removed.

SUMMARY OF THE INVENTION

The object of the present invention is therefore to propose a method of preparation of a monolithic hydrated alumina, the said method allowing effective growth of alumina from a part made of aluminium or an aluminium alloy.

Other objects of the present invention are also to propose methods of preparation of monolithic, amorphous or crystalline, anhydrous aluminas, monolithic aluminates and monolithic composites from hydrated aluminas produced according to the invention.

To do this, the invention relates to a method of preparation of a monolithic hydrated alumina, the said method comprising, in succession, the following steps:
a) abrading of a surface of a part made of aluminium or an aluminium alloy;
b) covering of the said surface with a mercury amalgam comprising at least one noble metal; and
c) exposure of the said covered surface obtained at b) to a wet oxidizing atmosphere.

According to the invention, it should be pointed out that, in what was mentioned above and follows later, the term "surface" is understood to mean "at least a portion" of the said part.

It should be noted, according to the invention, that the abrading step is intended to remove the passive oxidation layer possibly present on the surface of the aluminium or aluminium alloy part and may be carried out, for example, by cleaning the surface using a solvent, so as to remove the organic materials possibly deposited on the said surface, it being possible for this cleaning operation to be followed by mechanical abrading of the alumina layer (called the passive oxidation layer), for example by abrasion with water.

Advantageously, the method allows an ultra porous hydrated alumina monolith to be obtained that may have, depending on the experimental conditions, a density of 0.01 to 0.05 $g/cm^3$.

It is also possible with this method, according to the invention, to form monoliths, the cross section and the shape of which correspond to those of the surface of the part made of aluminium or an aluminium alloy, which serves as a base for depositing the amalgam, and the height of the said monolith is controlled solely by the imposed growth time.

According to the method of the invention, it is also possible to control the monolithic growth, for example by recovering the product formed when it has reached a desired height or by leaving the reaction to continue until the constituent aluminium or aluminium alloy of the part has been completely consumed, something which was not possible in the preparation methods of the prior art. Thus, with the said method, it is possible to obtain, in the case of complete oxidation of the aluminium, a monolith height which may reach, for example, close to 1000 times the thickness of the starting aluminium part.

In addition, the spongy structure of the monolithic hydrated aluminas obtained by the method allows large quantities of fluids to be absorbed and also allows physico-chemical or thermal exchange with gaseous phases, for example the ambient air, to take place.

It is thus possible to recover, within the hydrated monoliths, anhydrous liquids such as oils or various polluting or polluted products. By exchange with gaseous phases it is possible, for example, to fix, and thus remove from the ambient air, acid or basic vapours or various other pollutants.

Preferably, the method according to the invention furthermore includes a step of cooling the surface of the aluminium or aluminium alloy part, the said step being carried out simultaneously with the exposure step c). This is because, to ensure correct growth of the monolith, it is preferable to limit the temperature of the aluminium or aluminium alloy to maximum values of around 40-50° C., and preferably to temperatures close to the ambient temperature. Now, hydration and oxidation reactions occurring during the exposure step are highly exothermic and generate a great deal of heat, which may prevent the method from proceeding correctly. Thus, the amalgam-treated surface may advantageously be cooled via a heat extraction system, for example by circulation of a refrigerating liquid, the said system being connected directly to the covered surface obtained at step b). The cooling may also be carried out by fixing the aluminium or aluminium alloy surface to a metal block cooled by circulation of water coming from a cryostat. However, it is preferable not to cool down to too low a temperature so as to avoid condensation of the moisture in the wet oxidizing atmosphere.

According to one particular way of implementing the invention, the method may furthermore include, so as to improve the monolithic growth, at least one step of regenerating the surface covered with amalgam, the said regeneration step consisting in removing the amalgam previously deposited and then in redepositing an amalgam, as defined above, and in again exposing the newly covered surface to a wet oxidizing atmosphere.

For example, the amalgam is removed from the surface by a mechanical or chemical treatment, such as an acid washing treatment, which will remove the amalgam including impurities possibly present on the said surface.

This method of implementation is particularly advantageous when the surface of the aluminium or aluminium alloy part contains impurities, such as iron, copper or silicon, which impurities may contribute to prematurely impeding the monolithic growth when the content of these impurities is greater than a few hundred parts per million in the aluminium or aluminium alloy. The regeneration treatment may consist in removing the impure species present at the interface between the base surface and the amalgam by an appropriate treatment, such as acid washing. Such washing will remove the contaminated amalgam, which would no longer ensure correct alumina growth. The removal must be followed by a fresh deposit of amalgam, in order to restart the monolithic growth from the reactivated surface.

Preferably, the aluminium surface is a surface having an aluminium content of 99.99 to 99.999% by weight.

Advantageously, the use of an aluminium with such a content, within the context of this method, ensures monolithic growth without any retardation, owing to the minute presence of impurities within this material.

According to the invention, the aluminium surface may be a surface made of an aluminium alloy containing, for example about 1% magnesium.

The use of such an alloy does not hinder the monolithic growth of alumina because the magnesium, depending on the operating conditions applied, will oxidize without impeding the oxidation of the aluminium.

The mercury amalgam used within the context of the invention is a mercury amalgam that contains at least one noble metal.

The term "noble metal" is understood according to the invention to mean a metal that does not oxidize, either in air or in water, that is not attacked very easily by acids.

According to the invention, the noble metal included in the amalgam may be chosen from the group consisting of silver, gold, palladium, platinum, rhodium, iridium, ruthenium and mixtures thereof.

Preferably, the noble metal used in the mercury-based amalgam is silver. The use of such a metal is particularly advantageous as this is a relatively inexpensive noble metal, in particular in its nitrate form, which also gives excellent results within the context of this method.

According to the invention, the silver content of the mercury amalgam may range from 1 to 43 at %, preferably substantially equal to 40 at %, of silver.

The optimum noble metal content of the amalgam in order to obtain a given monolithic growth rate and a given density of the monolith may be readily determined by a person skilled in the art.

According to the invention, the step of covering the aluminium or aluminium alloy surface with the amalgam may be envisaged in various possible ways.

According to a first possible way, the covering step may be carried out by direct deposition of the amalgam in liquid form on the surface to be covered. This version requires prior preparation of the amalgam before deposition. For example, the amalgam is prepared by mixing a defined quantity of solid noble metal into liquid mercury.

According to a second possible way, the covering step may be carried out by depositing a mercury salt and at least one noble metal salt directly on the surface, the amalgam forming directly on the said surface by an oxidation-reduction reaction. In general, the mercury salt and the salt of the chosen noble metal are in the form of solutions of mercury nitrate and of the nitrate of the chosen noble metal. For example, these solutions have a mercury concentration of 0.05 to 0.1 mol/l and a noble metal, such as silver, concentration of 0.001 to 0.03 mol/l.

According to this second possible way, either the deposition is carried out in two steps, for example by immersing, in succession, the surface to be covered in a mercury salt solution and then in a noble metal salt solution, or in a single step, for example by immersing the surface to be covered in a solution containing both salts. It should be noted that, according to these two alternatives, the noble-metal-based mercury amalgam forms directly on the aluminium or aluminium alloy surface.

According to one particularly advantageous method of implementing the invention, the oxidizing atmosphere, in which the hydrated alumina is manufactured according to the invention, is air. Thus, the alumina may be manufactured, according to this method of implementation, directly in the open air, without having to use a suitable oxidizing atmosphere.

Preferably, the moisture content of the oxidizing atmosphere ranges from 20 to 99.99%. Such a moisture content allows a correct hydration reaction to take place, in so far as the growth rate of the monolith is substantially proportional to the moisture content. To benefit from such a moisture content, the usual relative humidity of temperate climates may be very satisfactory. However, in very dry weather, having an open water-filled container nearby may provide sufficient humidity. If it is desired to ensure that the growth conditions are strictly controlled, it is possible to regulate the relative humidity, for example using an environmental chamber or any similar device.

The temperature at which the exposure step c) may be carried out may be substantially the ambient temperature. However, of course this temperature must preferably not be too low, so as to prevent the atmospheric moisture from condensing.

Thus, there is obtained after carrying out the method according to the invention a monolithic hydrated alumina consisting of one phase, the composition of which is close to $Al_2O_3.4H_2O$. This alumina is ultra light, of low density, which may be between $1\times10^{-2}$ and $5\times10^{-2}$ g/cm$^3$ with a porosity possibly greater than 99%, and of high specific surface area, which may range from 300 to more than 400 m$^2$/g.

From the structural standpoint, the hydrated alumina obtained according to the method of the invention comprises an assembly of nanostructured entangled fibres with a mean diameter, for example, of about 5 nanometers, in such a way as to form a monolith. Apart from the interstices between the fibres, which form a randomly directed porosity, the alumina may include, according to the invention, another porosity formed by channels having a mean diameter of a few microns, the said channels being mutually parallel and oriented along the growth direction of the material.

The object of the present invention is also methods of manufacturing monolithic amorphous anhydrous aluminas or monolithic crystalline anhydrous aluminas from the hydrated aluminas obtained according to the method described above.

Thus, it is possible to produce, from a hydrated alumina obtained according to the method described above, a monolithic amorphous anhydrous alumina by heating the said hydrated alumina to a suitable temperature, i.e. a temperature allowing the initial hydrated alumina to dehydrate.

According to the invention, it is also possible to prepare a monolithic alumina crystallized in the δ, γ, θ, κ, κ' or α alumina form by heating the aforementioned hydrated alumina to a suitable temperature. In this case, the expression "suitable temperature" is understood to mean a temperature that allows the crystalline phase in question to be obtained. This temperature may be readily determined by a person skilled in the art using techniques such as X-ray diffraction analysis, the suitable temperature being chosen when the peaks relating to the desired crystalline phase appear in the X-ray diffraction diagram.

In general, the heating temperature for obtaining anhydrous aluminas may for example be from 200° C. to about 850° C. for an amorphous alumina, from about 850° C. to about 1100° C. for a γ-alumina, from about 1100° C. to about 1200° C. for a θ-alumina, and above 1200° C. for an α-alumina.

It is thus possible to obtain an alumina crystallized in its γ form, the density of which may range from $10 \times 10^{-2}$ to $50 \times 10^{-2}$ g/cm$^3$, with a high porosity of around 90% and a specific surface area that may range from 100 to more than 150 m$^2$/g.

It is thus possible to obtain an alumina crystallized in its α form, the density of which may range from $20 \times 10^{-2}$ to $200 \times 10^{-2}$ g/cm$^3$, with a porosity ranging from 10 to 80%.

However, the density and the porosity of the monolith, for the various anhydrous aluminas presented above, depend on the temperature and the heating time, these heat treatments being accompanied by a reduction in the dimensions of the monolith, while still preserving the shape of the starting product. These parameters may be readily set, by a person skilled in the art, depending on the desired criteria.

It is thus possible to obtain, using these methods, porous monolithic aluminas that are amorphous or are crystallized in various allotropic forms, the said aluminas having a porous structure similar to the starting product, in so far as the porous structure of the starting hydrated alumina remains during the heat treatments. It should also be noted that the size of the constituent particles of the alumina increases with the heating temperature, as does the density, although the specific surface area decreases. These ultra porous crystalline aluminas may be impregnated with a liquid or gaseous phase. It is thus possible to insert various chemical species into them, such as oxides, polymers, carbon-containing products or divided metals, and to subject them to an optional heat treatment, for example to form catalysts, thermal or acoustic insulators, nuclear containment or radioelement transmutation matrixes, refractory materials having specific properties, infrared-transparent windows, and filtration membranes.

The methods of preparing aluminas of the γ or θ type, called "transition aluminas", may include an additional step before the heating step, the said additional step being intended to stabilize the said crystalline aluminas, especially heated to temperatures of 1200 to 1430° C., the temperature range within which the a phase usually forms. This stabilization step also allows nanoscale fibres or particles to be maintained at these temperatures.

Thus, the method of manufacturing crystalline aluminas of the abovementioned type, that is to say of the γ or θ type, may furthermore include, before the heating step, a preliminary step of exposing the hydrated alumina prepared using the method of the invention explained above to vapours of at least one oxide precursor at a substantially ambient temperature.

For example, these oxide precursors may be silica precursors, such as tetraethoxysilane or trimethylethoxysilane. It is thus possible to obtain, for these transition aluminas, after heating, a silica content of 2 to 3% by weight, thus contributing to stabilizing the said aluminas.

The method of manufacturing aluminas crystallized in the δ, γ, θ, κ, κ' or α form may furthermore include, before the heating step, a step of exposing the hydrated alumina to acid or basic vapours at a substantially ambient temperature. For example, the acid vapours are hydrochloric acid vapours.

The basic vapours may be ammonia vapours.

The treatment with acid or basic vapours results in the appearance of hydrated aluminium chloride when treated with hydrochloric acid or aluminium hydroxide when treated with ammonia. These treatments contribute to modifying the temperatures at which various alumina phases appear. For example, after acid treatment, the κ and κ' transition alumina forms appear between 800 and 980° C., and the a phase forms above 1000° C. For example, after ammonia treatment, the δ form is obtained between 800 and 1000° C., while the θ form is obtained at about 1000° C. After heating the ammonia-treated monoliths to temperatures of 300 to 800° C., the specific surface area greatly increases, reaching values of 400 m$^2$/g, with a microporous surface area of more than 100 m$^2$/g. This high microporosity is useful, especially for applications in catalysis.

The subject of the present invention is also a method of preparation of a monolithic aluminate, prepared from hydrated aluminas, amorphous anhydrous aluminas and/or crystalline anhydrous aluminas that are obtained using one of the methods explained above.

It should be mentioned that, according to the invention, the term aluminate is understood to mean an oxide containing, in its crystal lattice, in addition to oxygen, at least two metal elements, including aluminium.

This method comprises, in succession:

d) a step of impregnating an alumina with at least one compound containing one or more metal elements to be introduced into the alumina, in order to form the aluminate, the said alumina being produced by one of the methods described above; and e) a step of decomposing the compound introduced at d) by heating it, followed by a step of forming the aluminate by heating.

The compound chosen may for example be tetraethoxysilane, in order to form aluminosilicates such as mullite (for example of formula $2SiO_2 \cdot 3Al_2O_3$). The compound chosen may be salts of metal elements, in order to form for example spinels, such as those satisfying the formula $MgAl_2O_4$, or to form garnets, such as those satisfying the formula $Y_3Al_5O_{12}$.

According to the invention, the metal salt may be chosen from the group consisting of magnesium, titanium, iron, cobalt, copper, nickel, yttrium, actinide and lanthanide nitrates or chlorides, and mixtures thereof.

The suitable temperatures needed, on the one hand, for the decomposition of the compounds comprising the metal element or metal elements to be introduced into the alumina and, on the other hand, for the introduction of the said metal element or elements into the lattice of the alumina, so as to form the aluminate, may be readily determined by a person skilled in the art by X-ray diffraction, as already mentioned above.

For example, the step of decomposing the compound comprising the metal element or elements to be introduced into the alumina in order to form the aluminate is carried out in air at a temperature substantially equal to 500° C. and the step of forming the aluminate, consisting in introducing free metal elements into the alumina lattice by the decomposition of the said compound, may be carried out in air, for example by heating to a temperature ranging from 700 to 1400° C.

Such aluminates are applicable in many fields, such as thermal or acoustic insulation, catalysis, storage of nuclear waste, preparation of radioelement transmutation targets, refractory materials having specific properties, infrared-transparent windows, and membranes.

The subject of the present invention is also the preparation of composite materials based on amorphous and/or crystalline aluminas and/or aluminates produced according to the methods explained above.

Thus, according to the invention, the method of preparation of a composite material comprising an alumina and/or an aluminate, as produced above, and at least one other compound and/or element comprises, in succession, the following steps:

f) a step of impregnating the alumina and/or the aluminate with at least one precursor of the other compounds and/or element(s); and g) a step of forming the said compound(s) and/or element(s), the compound(s) and/or element(s) forming with the alumina and/or the aluminate, after this step, the composite material.

The other compound that may form a composite material with an alumina and/or an aluminate obtained according to the method of the invention may be chosen from a group consisting of ceramics, metals, polymers and mixtures thereof.

An element that may form a composite material with an alumina and/or an aluminate obtained using a method of the invention may be elemental carbon, the said elemental carbon being able to be chosen from the group consisting of graphite, pyrolytic carbon, glassy carbon and mixtures thereof.

By way of examples, the compound precursor, when the other compound is a ceramic, may be a metal salt chosen from the group consisting of sodium metatungstate, ammonium metatungstate, zirconium oxychloride, calcium, yttrium, actinide, lanthanide, magnesium, copper, iron, cobalt and nickel nitrates, diammonium titanyl oxalate, titanium and barium chlorides, and mixtures thereof.

In general, the step of forming the ceramic corresponding to these salts may be produced, in air, by heating the said precursors to a temperature of between 400° C. and 800° C. This heating serves, on the one hand, to decompose the salts, thus releasing the metal elements, and, on the other hand, to oxidize the said metal elements. For example, when the salt is zirconium oxychloride, the heating step makes it possible to obtain a ceramic of the zirconia $ZrO_2$ type. This ceramic thus forms with the alumina and/or the aluminate a composite material.

Such composite materials may be applicable in many fields, such as thermal or acoustic insulation, catalysis, storage of nuclear waste or preparation of radioelement transmutation targets, refractory materials having specific properties, infrared-transparent windows, and membranes.

As examples, the compound precursor, when the other compound is a metal, may be a metal salt chosen from the group consisting of iron, cobalt, copper, nickel, lead, tin, zinc, tungsten and molybdenum nitrates, sodium metatungstate, ammonium metatungstate, salts of noble metals (silver, gold, palladium, platinum, rhodium, iridium, ruthenium), and mixtures thereof.

The step of forming the metal involved in the composition of the composite material comprises a step of decomposing the salt or salts, which is carried out in air at a temperature substantially equal to 500° C., by means of which the metal oxide corresponding to the metal element is obtained after this step, or to a temperature of 800 to 1200° C., followed by a reduction step by heating the said metal oxide in order to obtain the metal.

When the decomposition step is carried out within the 800 to 1200° C. temperature range, it is possible to form a pure aluminate, by reaction between the alumina and the metal oxide formed, especially one with a spinel structure, or a metal oxide/aluminate or alumina/aluminate mixture depending on the inserted alumina/oxide molar ratios.

The reduction step, intended to reduce the metal oxide coming from the salt or from the aluminate possibly formed, may be envisaged by the action of a reducing agent chosen from the group consisting of hydrogen and carbon monoxide, at a suitable temperature, preferably ranging from 500 to 1200° C.

The advantage provided by such a method is the obtention of composite materials especially by treatment at lower temperatures than those usually required for carrying out the solid-state reaction with conventional powders. This is because, especially owing to the nanoscale dimensions of the constituent grains of the aluminas prepared according to the invention, these have an extremely high reactivity.

Such composite materials may be applicable in many fields, such as catalysis, magnetism, especially for high-frequency applications, and, more generally, any property induced by the dispersion of fine metal particles in a solid, chemically or thermally stable, material.

As regards the composite materials according to the invention with polymers, the polymer precursor may be a monomer or a monomer mixture, the step of forming the polymer being a conventional polymerization step.

As an example of a monomer, mention may be made of a monomer chosen from the group consisting of styrene, aniline, isoprene, ethylene, vinyl chloride, butadiene and mixtures thereof.

As regards the composite materials according to the invention with elemental carbon, the precursor of the said carbon may be a hydrocarbon, the step of forming elemental carbon consisting of a thermal cracking step.

It should be mentioned that, according to the invention, the term "elemental carbon" is understood to mean carbon that may be in the form of graphite, pyrolytic carbon, amorphous carbon, glassy carbon and mixtures thereof.

Such materials may be applicable in many fields, such as the reinforcement and stabilization of plastics, thermal or acoustic insulation, catalysis and applications of nanotubes or fibres, such as carbon nanotubes or fibres.

The invention will now be described with reference to the following examples, these being given by way of illustration but implying no limitation.

DETAILED DESCRIPTION OF PARTICULAR EMBODIMENTS

EXAMPLE 1

This example illustrates the preparation of a hydrated monolithic alumina.

The starting material was a plate of 99.99% pure aluminium 1 mm in thickness.

Firstly, the metal surface was prepared by cleaning it with a solvent (acetone or alcohol) or a detergent, so as to remove the organic matter, and by mechanically abrading the alumina passivation layer by abrasion with a stream of water. The surface was then rinsed with deionized water and left covered by a film of water.

Secondly, the surface thus prepared was covered with a liquid mercury amalgam containing 40 at % silver by rubbing the surface with the liquid amalgam prepared beforehand.

Finally, the covered surface was fixed to a metal block cooled by circulation of 15° C. water coming from a cryostat. The surface was exposed to the atmospheric air with a relative humidity of 50% at the ambient temperature of 20° C. The oxidation reaction started immediately by the instantaneous appearance of a translucent layer visible to the eye after a few seconds. This layer then continued to grow in the form of a monolith perpendicular to the aluminium plate at a rate of 5 mm per hour. After four days of growth, a monolith close to one meter in length was obtained. It had the formula $Al_2O_3.4H_2O$.

EXAMPLE 2

This example also illustrates the preparation of a hydrated monolithic alumina according to another embodiment.

The starting material was a 99.99% pure aluminium plate 1 mm in thickness.

Firstly, the metal surface was cleaned using a solvent as in Example 1, so as to remove the organic matter, then immersed in an acid or basic solution, such as a sodium hydroxide or hydrochloric acid solution, for a few minutes in order to remove the passivating alumina layer and then rinsed with deionized or distilled water, with no subsequent drying.

Secondly, the aluminium surface was dipped in succession, for a few minutes, into a mercury salt solution and more precisely a mercury nitrate solution having a concentration of between 0.05 and 0.1 mol/l, and then into a silver salt solution, more precisely a silver nitrate solution having a concentration of between 0.001 and 0.03 mol/l.

The exposure step was carried out under the same conditions as in Example 1.

This example resulted in a hydrated monolithic alumina of general formula $Al_2O_3.4H_2O$.

EXAMPLE 3

This example illustrates the preparation of a hydrated monolithic alumina according to another embodiment.

The same operating method as in Example 2 was followed, except that the covering step with the liquid mercury amalgam was carried out in a single step, by dipping the surface to be treated into a solution containing both salts.

This example resulted in a hydrated monolithic alumina of general formula $Al_2O_3.4H_2O$.

EXAMPLE 4

This example illustrates the preparation of nanoscale monoliths of anhydrous amorphous alumina.

In this example, the hydrated alumina prepared in Example 1, 2 or 3 was used as starting product. The said alumina was heated to a temperature of 200 to 870° C.

EXAMPLE 5

This example illustrates the preparation of γ-alumina monoliths. In this example, the hydrated alumina prepared in Example 1, 2 or 3 was used as starting product. The said alumina was heated in air to temperatures of between 870° C. and 1100° C. in order to obtain a monolithic alumina crystallized in the γ form.

EXAMPLE 6

This example illustrates the preparation of θ-alumina monoliths.

In this example, the hydrated alumina prepared in Example 1, 2 or 3 was used as starting product.

The said alumina was heated in air to temperatures of between 1100° C. and 1200° C. in order to obtain a monolithic alumina crystallized in the θ form.

EXAMPLE 7

This example illustrates the preparation of α-alumina monoliths.

In this example, the hydrated alumina prepared in Example 1, 2, or 3 was used as starting product.

The said alumina was heated in air to temperatures above 1200° C. in order to obtain a monolithic alumina crystallized in the a form.

EXAMPLE 8

This example illustrates the preparation of stabilized γ-alumina or θ-alumina monoliths.

In this example, the hydrated alumina prepared in Example 1, 2 or 3 was used as starting product. This product was brought into contact with trimethylethoxysilane (TMES) vapour in a closed container or by continuously circulating TMES vapour. The duration of the treatment, carried out at a temperature close to the ambient temperature, was from 10 to 120 minutes.

After removing the excess TMES by drying in an oven at 100° C., the aluminas were calcined at temperatures of between 870° C. and 1420° C.

The γ phase was obtained by heating between 870 and 1300° C. The θ phase was obtained by heating between 1300° C. and 1420° C. The monolithic θ-aluminas thus obtained were able to undergo, without being damaged, the usual preparation conditions for catalysts and in particular the impregnation with aqueous solutions, while maintaining the integrity of the monolith. These monoliths contained 3 to 10% silica by weight.

EXAMPLE 9

This example illustrates the preparation of monoliths of aluminates, for example mullite.

In this example, the hydrated alumina prepared in Example 1, 2 or 3 was used as starting material. This product was brought into contact with tetraethoxysilane (TEOS) vapour in a closed container, or by continuously circulating TEOS vapour. The duration of the treatment, carried out at a temperature close to the ambient temperature, was between 1 and 6 days.

After removing the excess TEOS by drying in an oven at 100° C., the monoliths were calcined at temperatures of between 980 and 1400° C. in order to obtain the appropriate aluminate.

EXAMPLE 10

This example illustrates the preparation of aluminate monoliths, for example a monolith of magnesium aluminate with a spinel structure.

In this example, an alumina prepared in Example 6, 7 or 8 was used as starting material. The starting material was impregnated with an aqueous magnesium nitrate solution by immersing the said material in the said solution or by infiltrating the said solution into the said material. By controlling the concentration of the salt solution and of the degree of impregnation it was possible to obtain the desired stoichiometry for forming the compound $MgAl_2O_4$.

The alumina thus impregnated was then heated to a temperature of 700 to 1000° C. so as to decompose the metal salt and form, by insertion of the Mg elements into the alumina lattice, the compound of spinel structure.

EXAMPLE 11

This example illustrates the preparation of monoliths of an alumina or aluminate composite material with a ceramic compound, such as for example yttrium-stabilized zirconium oxide.

In this example, an alumina or an aluminate prepared in Example 6, 7, 8, 9 or 10 was used as starting product. The starting material was impregnated with an aqueous zirconium oxychloride/yttrium chloride solution by immersing the said material in the said solution or by infiltrating the said solution into the said material. By controlling the concentration of the salt solution and degree of impregnation it was possible to obtain the desired oxide composition. This may vary from less than 1% to more than 80% by weight.

The alumina or aluminate thus impregnated was then heated to a temperature of between 700 and 1300° C. so as to decompose the metal salt and form the stabilized zirconia.

EXAMPLE 12

This example illustrates the preparation of a composite material consisting of an alumina or aluminate (optionally containing another oxide) with a metal, for example nickel.

In this example, an alumina or aluminate prepared in Example 6, 7, 8, 9 or 10 was used as base material.

The alumina or aluminate was impregnated with a nickel nitrate solution by immersing the said alumina or aluminate (optionally containing another oxide) in said solution or by infiltrating the said solution into the alumina or aluminate or into the composite with another oxide.

By controlling the concentration of the salt solution and the degree of impregnation it was possible to obtain the desired stoichiometry. This may vary from less than 1% to more than 80% by weight of metal contained in the composite.

The alumina thus impregnated was then heated to a temperature of 400 to 500° C., so as to decompose the metal salt, and then reduced under $H_2$ or CO at a temperature of 500 to 800° C.

EXAMPLE 13

This example illustrates the preparation of a composite material consisting of an alumina or aluminate (optionally containing another oxide and/or a metal) with a polymer, such as polystyrene.

In this example, an alumina or aluminate according to Example 6, 7, 8, 9 or 10 was used as base material. The base material was impregnated with liquid styrene. This was prepared by washing with a sodium hydroxide solution, rinsing, drying and then adding benzyl peroxide. The material was polymerized in an oven at 80° C. for more than 24 hours.

EXAMPLE 14

This example illustrates the preparation of a composite material consisting of an alumina or aluminate (optionally containing another oxide and/or a metal) with a carbon product, for example, carbon nanotubes.

In this example, an alumina or aluminate or a composite prepared in Examples 6, 7, 8, 9, 10, 11 or 12 was used as base material. The base material was treated with a gas, such as acetylene, ethylene, propylene or methane, which, by cracking it, for example by heating between 500 and 1200° C., gave carbon nanotubes.

BIBLIOGRAPHIC REFERENCES

[1]: Kolloid Z., 2, 1908, 11.
[2]: J. Markel et al. in Journal of Non-Crystalline Solids, 180 (1994), 32.

The invention claimed is:

1. Method of preparation of a monolithic hydrated alumina, said method comprising, in succession, the following steps:
   a) abrading of a surface of a part made of aluminium or an aluminium alloy;
   b) covering said aluminium or aluminium alloy surface with a mercury amalgam comprising at least one noble metal, wherein the at least one noble metal is chosen from the group consisting of silver, gold, palladium, platinum, rhodium, iridium, ruthenium and mixtures thereof; and
   c) exposing said covered surface obtained at b) to a wet oxidizing atmosphere thereby growing said monolithic hydrated alumina on said aluminium or aluminium alloy surface.

2. Method of preparation according to claim 1, which furthermore includes a step of cooling said surface, said step being carried out simultaneously with the exposure step c).

3. Method of preparation according to claim 2, in which the cooling step is carried out by means of a heat extraction system connected directly to the surface obtained at b).

4. Method of preparation according to claim 1, which furthermore includes at least one step of regenerating the surface covered with amalgam, said regeneration step consisting in removing the amalgam previously deposited and then in redepositing an amalgam, as defined in claim 1, and in again exposing the newly covered surface to a wet oxidizing atmosphere.

5. Method of preparation according to claim 1, wherein the aluminium surface is a surface having an aluminium content of 99.99 to 99.999% by weight.

6. Method of preparation according to claim 1, in which the noble metal is silver.

7. Method of preparation according to claim 6, wherein the mercury amalgam has a silver content ranging from 1 to 43 wt % silver.

8. Method of preparation according to claim 1, in which the covering step b) is carried out by direct deposition of the amalgam in liquid form on the surface to be covered.

9. Method of preparation according to claim 1, in which the covering step is carried out by depositing a mercury salt and at least one noble metal salt directly on the surface, the amalgam forming directly on said surface.

10. Method of preparation according to claim 1, in which the oxidizing atmosphere is air.

11. Method of preparation according to claim 1, in which the wet oxidizing atmosphere is such that it has a relative humidity ranging from 20% to 99.99%.

12. Method of preparation according to claim 1, in which the exposure step c) is carried out substantially at ambient temperature.

13. Method of preparation of a monolithic amorphous anhydrous alumina, which includes a step of heating the hydrated alumina prepared by a method according to claim 1 to an appropriate temperature.

14. Method of preparation of a monolithic alumina crystallized in the δ, γ, θ, κ, κ', or α form, which includes a step of heating the hydrated alumina prepared by a method according to claim 1 to an appropriate temperature.

15. Method of preparation according to claim 14, which includes, when the alumina is of the γ or θ type, before the heating step, a step of exposing the hydrated alumina to the vapour of at least one oxide precursor at a substantially ambient temperature.

16. Method of preparation according to claim 15, in which the, or at least one, oxide precursor is a silica precursor.

17. Method of preparation according to claim 16, in which the, or at least one, silica precursor is chosen from the group consisting of tetraethoxysilane and trimethylethoxysilane.

18. Method of preparation according to claim 14, which further includes, when the alumina is of the δ, γ, θ, κ, κ', or α type, before the heating step, a step of exposing the hydrated alumina to the vapour of an acid or base at a substantially ambient temperature.

19. Method of preparation according to claim 18, in which the acid vapour is hydrochloric acid vapour.

20. Method of preparation according to claim 18, in which the base vapour is ammonia vapour.

21. Method of preparation of a monolithic aluminate, which comprises in succession:
    d) a step of impregnating an alumina with at least one compound containing one or more metal elements to be introduced into said alumina, in order to form the aluminate, said alumina being produced by a method according to claim 1; and
    e) a step of decomposing said compound introduced at d) by heating it, followed by a step of forming the aluminate by heating.

22. Method of preparation according to claim 21, in which the compound comprising the metal element or elements to be introduced is tetraethoxysilane.

23. Method of preparation according to claim 21, in which the compound comprising the metal element or elements to be introduced is a metal salt chosen from the group consisting of magnesium, titanium, iron, cobalt, copper, nickel, yttrium, actinide and lanthanide nitrates or chlorides, and mixtures thereof.

24. Method of preparation according to claim 21, in which the step of decomposing the compound chosen is carried out in air by heating to a temperature substantially equal to 500° C.

25. Method of preparation according to claim 21, in which the step of forming the aluminate is carried out in air by heating to a temperature ranging from 700 to 1400° C.

26. Method of preparation of a composite material comprising a monolithic hydrated alumina and/or an aluminate and at least one other compound and/or element, wherein said alumina is obtained by a method comprising, in succession, the following steps:
    a) abrading surface of a part made of aluminium or an aluminium alloy;
    b) covering said aluminium or aluminium alloy surface with a mercury amalgam comprising at least one noble metal, wherein the at least one noble metal is chosen from the group consisting of silver, gold, palladium, platinum, rhodium, iridium, ruthenium and mixtures thereof; and
    c) exposing said covered surface obtained at b) to a wet oxidizing atmosphere thereby growing said monolithic hydrated alumina on said aluminium or aluminium alloy surface, wherein said aluminate is obtained by a method which comprises in succession:
    d) a step of impregnating an alumina with at least one metal compound containing one or more metal elements to be introduced into said alumina, in order to form the aluminate, said alumina being produced as above; and
    e) a step of decomposing said at least one metal compound introduced at d) into free metal elements by heating the impregnated alumina, followed by a step of forming the aluminate by heating the impregnated alumina,
    said method of preparation of a composite material comprising in succession, the following steps:
    f) a step of impregnating the alumina and/or the aluminate with at least one precursor of said at least one other compound and/or element; and
    g) a step of forming said at least one other compound and/or element, and
    h) a step of forming the composite material with the formed at least one other compound and/or element.

27. Method of preparation according to claim 26, in which the at least one other compound is chosen from a group consisting of ceramics, metals, polymers and mixtures thereof.

28. Method of preparation according to claim 26, in which the at least one element is elemental carbon.

29. Method of preparation according to claim 28, in which the elemental carbon is chosen from the group consisting of graphite, pyrolytic carbon, glassy carbon and mixtures thereof.

30. Method of preparation according to claim 27, in which, when the at least one other compound is a ceramic, the precursor of this at least one other compound is a metal salt chosen from the group consisting of sodium metatungstate, ammonium metatungstate, zirconium oxychloride, calcium, yttrium, actinide, lanthanide, magnesium, copper, iron, cobalt and nickel nitrates, diammonium titanyl oxalate, titanium and barium chlorides, and mixtures thereof.

31. Method of preparation according to claim 27, in which the step of forming the ceramic is produced, in air, by heating said precursors to a temperature of between 400° C. and 800° C.

32. Method of preparation according to claim 27, in which, when the at least one other compound is a metal, the precursor of this at least one other compound is a metal salt chosen from the group consisting of iron, cobalt, copper, nickel, lead, tin, zinc, tungsten and molybdenum nitrates, sodium metatungstate, ammonium metatungstate, salts of noble metals (silver, gold, palladium, platinum, rhodium, iridium, ruthenium), and mixtures thereof.

33. Method of preparation according to claim 32, in which the step of forming the metal comprises a step of decomposing the metal salt or salts, which is carried out in air at a temperature substantially equal to 500° C. or at a temperature of 800 to 1200° C., by means of which a metal oxide is obtained after this step, followed by a reduction step, by heating said metal oxide in order to obtain the metal.

34. Method of preparation according to claim 33, in which the reduction step is carried out by the action of a reducing agent chosen from the group consisting of hydrogen and carbon monoxide at a suitable temperature.

35. Method of preparation according to claim 27, in which, when the at least one other compound is a polymer, the precursor of this compound is a monomer or a monomer mixture.

36. Method of preparation according to claim 35, in which the monomer is chosen from the group consisting of styrene, aniline, isoprene, ethylene, vinyl chloride, butadiene and mixtures thereof.

37. Method of preparation according to claim 35, in which the step of forming the polymer consists of a polymerization step.

38. Method of preparation according to claim 28, in which, when the at least one element is elemental carbon, the precursor of this element is a hydrocarbon.

39. Method of preparation according to claim 38, in which the step for forming the elemental carbon consists of a thermal cracking step.

40. Method of preparation of a monolithic aluminate, which comprises in succession:
   d) a step of impregnating an alumina with at least one metal compound containing one or more metal elements to be introduced into said alumina, in order to form the aluminate, said alumina being produced by a method according to claim 13; and
   e) a step of decomposing said metal compound introduced at d) by heating the impregnated alumina, followed by a step of forming the aluminate by heating impregnated alumina.

41. Method of preparation of a monolithic aluminate, which comprises in succession:
   d) a step of impregnating an alumina with at least one metal compound containing one or more metal elements to be introduced into said alumina, in order to form the aluminate, said alumina being produced by a method according to claim 14 ; and
   e) a step of decomposing said metal compound introduced at d) by heating the impregnated alumina, followed by a step of forming the aluminate by heating impregnated alumina.

42. Method of preparation according to claim 26, wherein the alumina is obtained by a method which includes a step of heating the hydrated alumina to an appropriate temperature.

43. Method of preparation according to claim 26 wherein the alumina prepared is crystallized in the $\delta$, $\gamma$, $\theta$, $\kappa$, $\kappa'$, or $\alpha$ form, and wherein the alumina is obtained by a method which includes a step of heating the hydrated alumina to an appropriate temperature.

44. Method of preparation according to claim 30, in which the step for forming the ceramic is produced, in air, by heating said precursors to a temperature of between 400° C. and 800° C.

45. Method of preparation according to claim 36, in which the step for forming the polymer consists of a polymerization step.

46. Method of preparation according to claim 29, in which, when the element is elemental carbon, the precursor of this element is a hydrocarbon.

47. Method of preparation according to claim 6 wherein the mercury amalgam has a silver content substantially equal to 40 wt % silver.

48. Method of preparation according to claim 33, in which the reduction step is carried out by the action of a reducing agent chosen from the group consisting of hydrogen and carbon monoxide at a temperature ranging from 500 to 1200° C.

* * * * *